(12) United States Patent
Young et al.

(10) Patent No.: US 9,255,322 B2
(45) Date of Patent: Feb. 9, 2016

(54) SUBSTRATE PROCESSING SYSTEM HAVING SYMMETRIC RF DISTRIBUTION AND RETURN PATHS

(75) Inventors: Donny Young, Cupertino, CA (US); Alan Ritchie, Menlo Park, CA (US); Muhammad Rasheed, San Jose, CA (US); Keith A. Miller, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 842 days.

(21) Appl. No.: 13/436,776

(22) Filed: Mar. 30, 2012

(65) Prior Publication Data

US 2013/0256127 A1    Oct. 3, 2013

(51) Int. Cl.
*C23C 14/34* (2006.01)
*H01J 37/32* (2006.01)
*C23C 14/35* (2006.01)
*H01J 37/34* (2006.01)

(52) U.S. Cl.
CPC .............. *C23C 14/3407* (2013.01); *C23C 14/35* (2013.01); *H01J 37/32577* (2013.01); *H01J 37/3405* (2013.01); *H01J 37/3411* (2013.01); *H01J 37/3414* (2013.01)

(58) Field of Classification Search
CPC ..................... H01J 37/32577; H01J 37/32541; H01J 37/3438
See application file for complete search history.

(56) References Cited

U.S. PATENT DOCUMENTS

2004/0060817 A1* 4/2004 Clarke ..................... 204/298.07
2010/0096261 A1* 4/2010 Hoffman et al. ......... 204/298.08

OTHER PUBLICATIONS

U.S. Appl. No. 13/435,949, filed Mar. 30, 2012, Young et al.
U.S. Appl. No. 13/435,956, filed Mar. 30, 2012, Ritchie et al.
U.S. Appl. No. 13/435,766, filed Mar. 30, 2012, Ritchie et al.

* cited by examiner

*Primary Examiner* — Jason M Berman
(74) *Attorney, Agent, or Firm* — Moser Taboada; Alan Taboada

(57) ABSTRACT

A processing system may include a target having a central axis normal thereto; a source distribution plate having a target facing side opposing a backside of the target, wherein the source distribution plate includes a plurality of first features such that a first distance of a first radial RF distribution path along a given first diameter is about equal to a second distance of an opposing second radial RF distribution path along the given first diameter; and a ground plate opposing a target opposing side of the source distribution plate and having a plurality of second features disposed about the central axis and corresponding to the plurality of first features, wherein a third distance of a first radial RF return path along a given second diameter is about equal to a fourth distance of an opposing second radial RF return path along the given second diameter.

20 Claims, 3 Drawing Sheets

SUBSTRATE PROCESSING SYSTEM HAVING SYMMETRIC RF DISTRIBUTION AND RETURN PATHS

FIELD

Embodiments of the present invention generally relate to plasma-enhanced substrate processing systems.

BACKGROUND

Substrate processing systems, for example a physical vapor deposition (PVD) chamber, may be configured to provide RF power to sputter target material onto a substrate disposed in the chamber. In some embodiments, a central RF feed structure (centered with respect to a target of the PVD chamber) may be used to provide RF power from an RF source to the target to generate improved plasma uniformity. However, the inventors have discovered that the many openings disposed through one or more of components of the target assembly of the PVD chamber may still result in plasma non-uniformities that may negatively affect substrate processing.

Accordingly, the inventors have provided a PVD chamber having improved RF distribution and return paths.

SUMMARY

Substrate processing systems are provided herein. In some embodiments, a substrate processing system includes a target having a front side and an opposing backside, and a central axis normal to the front side and the backside, the target including a source material disposed on the front side, the source material to be deposited on a substrate; a source distribution plate having a first diameter bisected by the central axis and disposed between a first peripheral edge, the source distribution plate further having a target facing side opposing a backside of the target and a target opposing side opposite the target facing side, wherein the source distribution plate is electrically coupled to the target along a peripheral edge of the target, and wherein the source distribution plate includes a plurality of first features disposed about the central axis such that a first distance of a first radial RF distribution path between the central axis and the first peripheral edge along a given first diameter is about equal to a second distance of an opposing second radial RF distribution path between the central axis and the first peripheral edge along the given first diameter; and a ground plate opposing the target opposing side of the source distribution plate, the ground plate having a second diameter bisected by the central axis and disposed between a second peripheral edge, the grounding plate further having a plurality of corresponding second features disposed about the central axis, wherein a third distance of a first radial RF return path between the second peripheral edge and the central axis along a given second diameter is about equal to a fourth distance of an opposing second radial RF return path between the second peripheral edge and the central axis along the given second diameter.

In some embodiments, a substrate processing system includes a target having a front side and an opposing backside, and a central axis normal to the front side and the backside, the target including a source material disposed on the front side, the source material to be deposited on a substrate; a source distribution plate having a first diameter bisected by the central axis and disposed between a first peripheral edge, the source distribution plate further having a target facing side opposing a backside of the target and a target opposing side opposite the target facing side, wherein the source distribution plate is electrically coupled to the target along a peripheral edge of the target, and wherein the source distribution plate includes a plurality of first features disposed about the central axis such that a first distance of a first radial RF distribution path between the central axis and the first peripheral edge along a given first diameter is about equal to a second distance of an opposing second radial RF distribution path between the central axis and the first peripheral edge along the given first diameter; a ground plate opposing the target opposing side of the source distribution plate, the ground plate having a second diameter bisected by the central axis and disposed between a second peripheral edge, the grounding plate further having a plurality of corresponding second features disposed about the central axis, wherein a third distance of a first radial RF return path between the second peripheral edge and the central axis along a given second diameter is about equal to a fourth distance of an opposing second radial RF return path between the second peripheral edge and the central axis along the given second diameter; an RF feed structure coupled to the source distribution plate to provide RF energy to the source distribution plate, wherein the RF feed structure is aligned with the central axis; a cavity disposed between the backside of the target and the source distribution plate; and a magnetron assembly comprising a rotatable magnet disposed within the cavity and having an axis of rotation that is aligned with a central axis of the target.

In some embodiments, a substrate processing system includes a target having a front side and an opposing backside, and a central axis normal to the front side and the backside, the target including a source material disposed on the front side, the source material to be deposited on a substrate; a source distribution plate having a first diameter bisected by the central axis and disposed between a first peripheral edge, the source distribution plate further having a target facing side opposing a backside of the target and a target opposing side opposite the target facing side, wherein the source distribution plate is electrically coupled to the target along a peripheral edge of the target, and wherein the source distribution plate includes a plurality of first features symmetrically disposed about the central axis such that a first distance of a first radial RF distribution path between the central axis and the first peripheral edge along a given first diameter is about equal to a second distance of an opposing second radial RF distribution path between the central axis and the first peripheral edge along the given first diameter; a ground plate opposing the target opposing side of the source distribution plate, the ground plate having a second diameter bisected by the central axis and disposed between a second peripheral edge, the grounding plate further having a plurality of corresponding second features symmetrically disposed about the central axis, wherein a third distance of a first radial RF return path between the second peripheral edge and the central axis along a given second diameter is about equal to a fourth distance of an opposing second radial RF return path between the second peripheral edge and the central axis along the given second diameter; and an RF feed structure coupled to the source distribution plate to provide RF energy to the source distribution plate, wherein the RF feed structure is aligned with the central axis.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
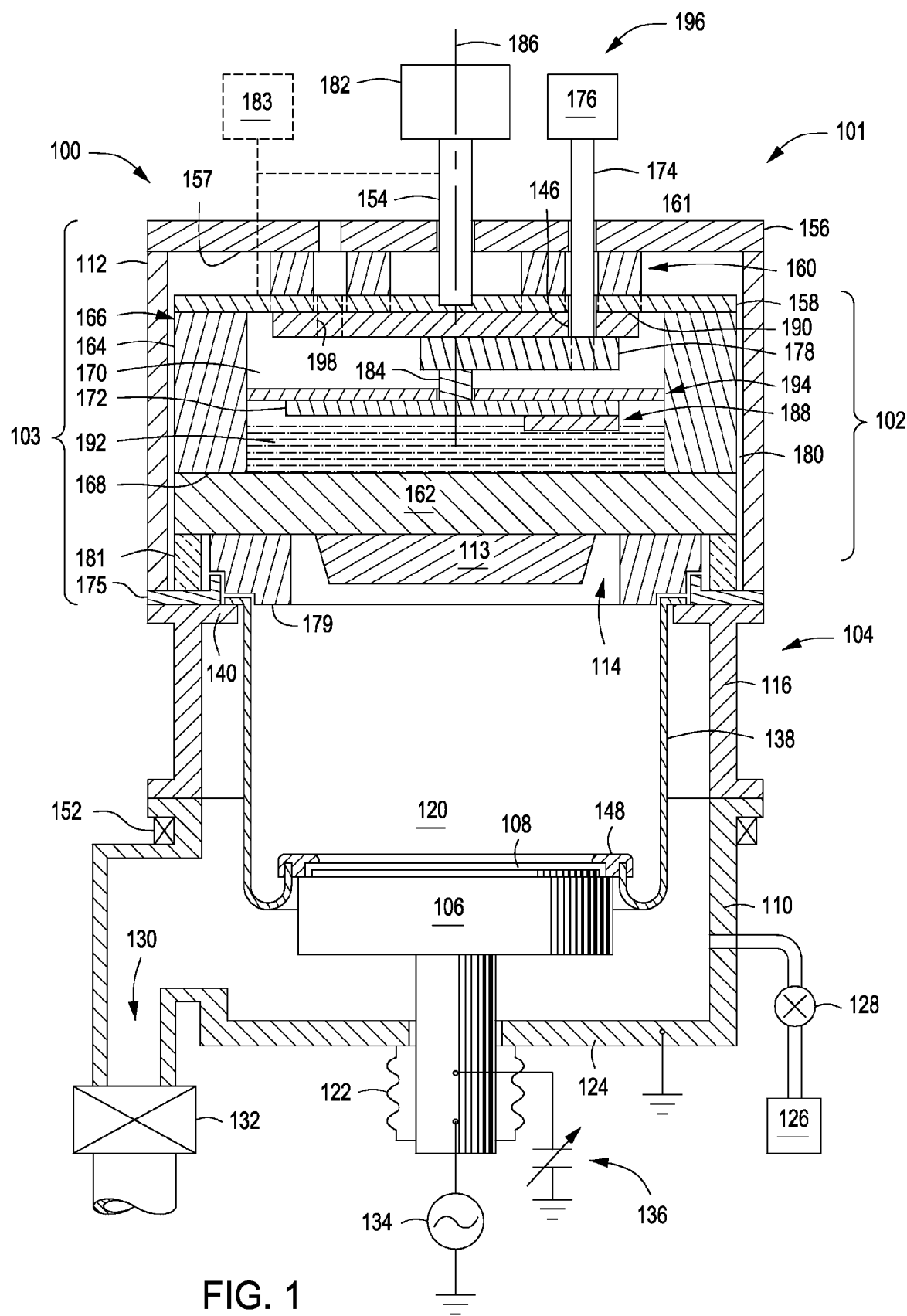
FIG. 1 depicts a schematic cross sectional view of a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Apparatus utilizing radio frequency (RF) energy for processing substrates are provided herein. Embodiments of the inventive apparatus may advantageously improve plasma uniformity in a process chamber by providing substantially similar length radial RF distribution paths in a source distribution plate of a PVD chamber in opposing directions from a central axis along common diameters of the source distribution plate, and by providing substantially similar length radial RF return paths in a source distribution plate of a PVD chamber in opposing directions from a central axis along common diameters of the grounding plate. The inventive apparatus may advantageously provide a substantially similar overall travel length of RF energy in each radial direction for any given diameter beginning proximate the center of the source distribution plate, traveling through various surfaces of the PVD chamber, and ending proximate the center of the grounding plate.

FIG. 1 depicts a simplified, cross-sectional view of a PVD chamber 100 in accordance with some embodiments of the present invention. Examples of PVD chambers suitable for modification in accordance with the teachings provided herein include the ALPS® Plus and SIP ENCORE® PVD processing chambers, both commercially available from Applied Materials, Inc., of Santa Clara, Calif. Other processing chambers from Applied Materials, Inc. or other manufacturers, including those configured for other types of processing besides PVD, may also benefit from modifications in accordance with the inventive apparatus disclosed herein.

In some embodiments of the present invention, the PVD chamber 100 includes a chamber lid 101 disposed atop a process chamber 104 and removable from the process chamber 104. The chamber lid 101 may include a target assembly 102 and a grounding assembly 103. The process chamber 104 contains a substrate support 106 for receiving a substrate 108 thereon. The substrate support 106 may be located within a lower grounded enclosure wall 110, which may be a chamber wall of the process chamber 104. The lower grounded enclosure wall 110 may be electrically coupled to the grounding assembly 103 of the chamber lid 101 such that an RF return path is provided to an RF power source 182 disposed above the chamber lid 101. Alternatively, other RF return paths are possible, such as those that travel from the substrate support 106 via a process kit shield (e.g., a shield 128 as discussed below) and ultimately back to the grounding assembly 103 of the chamber lid 101. The RF power source 182 may provide RF power to the target assembly 102 as discussed below.

The chamber lid 101 generally includes the grounding assembly 103 disposed about the target assembly 102. The grounding assembly 103 may include a ground plate 156 having a first surface 157 that may be generally parallel to and opposite a backside of the target assembly 102. A grounding shield 112 may extending from the first surface 157 of the ground plate 156 and surround the target assembly 102. The grounding assembly 103 may include a support member 175 to support the target assembly 102 within the grounding assembly 102.

In some embodiments, the support member 175 may be coupled to a lower end of the grounding shield 112 proximate an outer peripheral edge of the support member 175 and extends radially inward to support a seal ring 181, the target assembly 102 and, optionally, a dark space shield 179. The seal ring 181 may be a ring or other annular shape having a desired cross-section. The seal ring 181 may include two opposing planar and generally parallel surfaces to facilitate interfacing with the target assembly 102, such as the backing plate 162, on a first side of the seal ring 181 and with the support member 175 on a second side of the seal ring 181. The seal ring 181 may be made of a dielectric material, such as ceramic. The seal ring 181 may insulate the target assembly 102 from the ground assembly 103.

The dark space shield 179 is generally disposed about an outer edge of the target 114, such about an outer edge of a source material 113 of the target 114. In some embodiments, the seal ring 181 is disposed adjacent to an outer edge of the dark space shield 179 (i.e., radially outward of the dark space shield 179). In some embodiments, the dark space shield 179 is made of a dielectric material, such as ceramic. By providing a dielectric dark space shield 179, arcing between the dark space shield and adjacent components that are RF hot may be avoided or minimized. Alternatively, in some embodiments, the dark space shield 179 is made of a conductive material, such as stainless steel, aluminum, or the like. By providing a conductive dark space shield 179 a more uniform electric field may be maintained within the process chamber 100, thereby promoting more uniform processing of substrates therein. In some embodiments, a lower portion of the dark space shield 179 may be made of a conductive material and an upper portion of the dark space shield 179 may be made of a dielectric material. In some embodiments, the dark space shield 179 and the shield 138 may be conductive and fabricated as a single piece. In some embodiments, a conductive, single piece dark space shield 179 and portion of the shield 138 may be provided where the combined dark space shield 179 and portion of the shield 138 extends downward at least beyond the substrate support 106 when in a raised position.

The support member 175 may be a generally planar member having a central opening to accommodate the dark space shield 179 and the target 114. In some embodiments, the support member 175 may be circular, or disc-like in shape, although the shape may vary depending upon the corresponding shape of the chamber lid and/or the shape of the substrate to be processed in the process chamber 100. In use, when the chamber lid 101 is opened or closed, the support member 175 maintains the dark space shield 179 in proper alignment with respect to the target 114, thereby minimizing the risk of misalignment due to chamber assembly or opening and closing the chamber lid 101.

The target assembly 102 may include a source distribution plate 158 opposing a backside of the target 114 and electrically coupled to the target 114 along a peripheral edge of the target 114. The target 114 may comprise a source material 113 to be deposited on a substrate, such as the substrate 108 during sputtering, such as a metal, metal oxide, metal alloy, or the like. In some embodiments, the target 114 may include a backing plate 162 to support the source material 113. The source material 113 may be disposed on a substrate support facing side of the backing plate 162 as illustrated in FIG. 1. The backing plate 162 may comprise a conductive material, such as copper-zinc, copper-chrome, or the same material as the target, such that RF and DC power can be coupled to the source material 113 via the backing plate 162. Alternatively, the backing plate 162 may be non-conductive and may include conductive elements (not shown) such as electrical feedthroughs or the like.

A conductive member 164 may be disposed between the source distribution plate and the backside of the target 114 to propagate RF energy from the source distribution plate to the peripheral edge of the target 114. The conductive member 164 may be cylindrical, with a first end 166 coupled to a target-facing surface of the source distribution plate 158 proximate the peripheral edge of the source distribution plate 158 and a second end 168 coupled to a source distribution plate-facing surface of the target 114 proximate the peripheral edge of the target 114. In some embodiments, the second end 168 is coupled to a source distribution plate facing surface of the backing plate 162 proximate the peripheral edge of the backing plate 162.

The target assembly 102 may include a cavity 170 disposed between the backside of the target 114 and the source distribution plate 158. The cavity 170 may at least partially house a magnetron assembly 196 as discussed below. The cavity 170 is at least partially defined by the inner surface of the conductive member 164, a target facing surface of the source distribution plate 158, and a source distribution plate facing surface (e.g., backside) of the target 114 (or backing plate 162). In some embodiments, the cavity 170 may be at least partially filled with a cooling fluid 192, such as water ($H_2O$) or the like. In some embodiments, a divider 194 may be provided to contain the cooling fluid 192 in a desired portion of the cavity 170 (such as a lower portion, as shown) and to prevent the cooling fluid 192 from reaching components disposed on the other side of the divider 194, as discussed below.

An insulative gap 180 is provided between the ground plate 156 and the outer surfaces of the source distribution plate 158, the conductive member 164, and the target 114 (and/or backing plate 162). The insulative gap 180 may be filled with air or some other suitable dielectric material, such as a ceramic, a plastic, or the like. The distance between the ground plate 156 and the source distribution plate 158 depends on the dielectric material between the ground plate 156 and the source distribution plate 158. Where the dielectric material is predominantly air, the distance between the ground plate 156 and the source distribution plate 158 should be between 5 mm and 40 mm.

The grounding assembly 103 and the target assembly 102 may be electrically separated by the seal ring 181 and by one or more of insulators 160 disposed between the first surface 157 of the ground plate 156 and the backside of the target assembly 102, e.g., a target opposing side of the source distribution plate 158.

Figure 2:
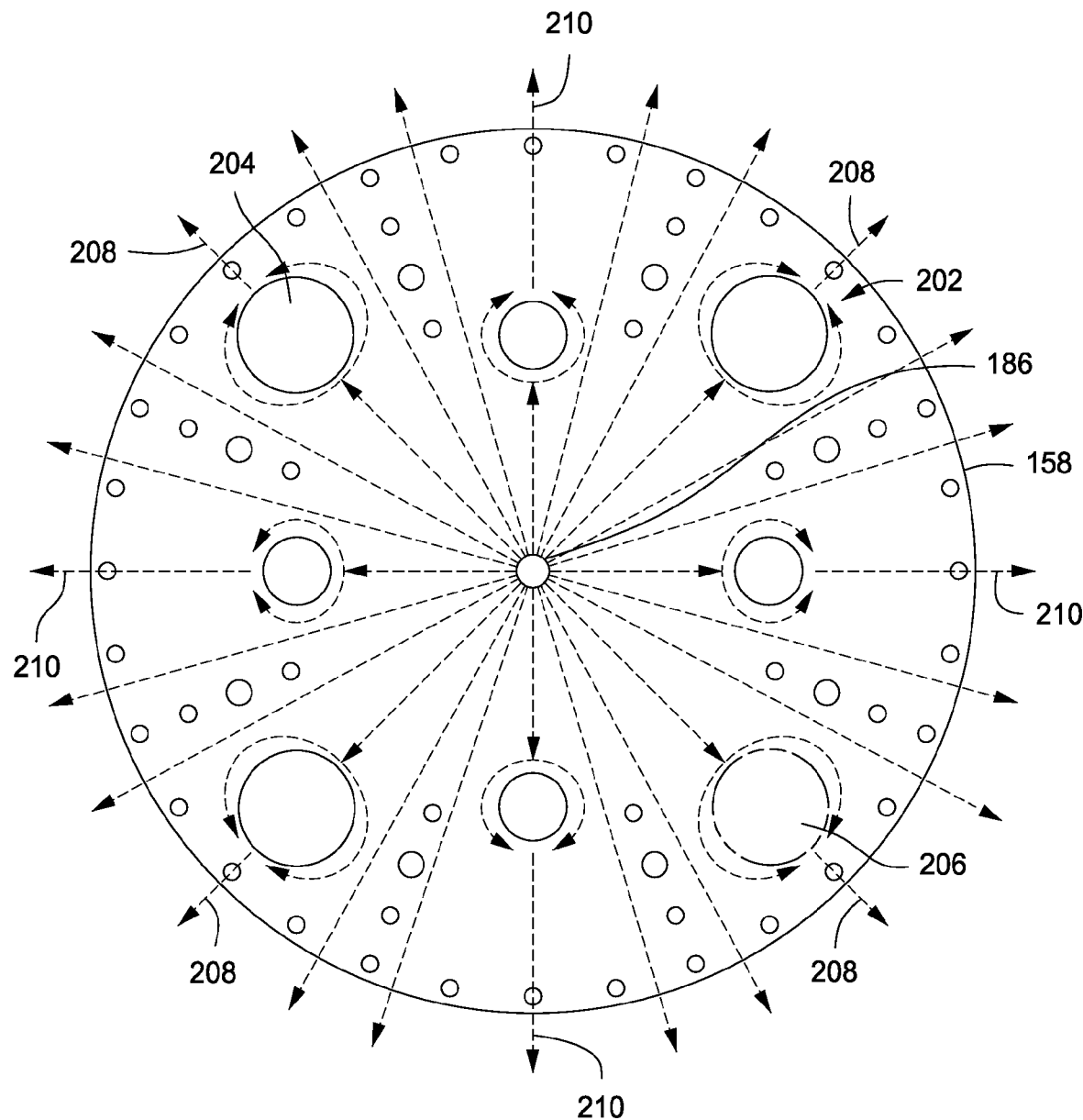
FIG. 2 depicts a schematic top view of a source distribution plate in accordance with some embodiments of the present invention.
Figure 3:
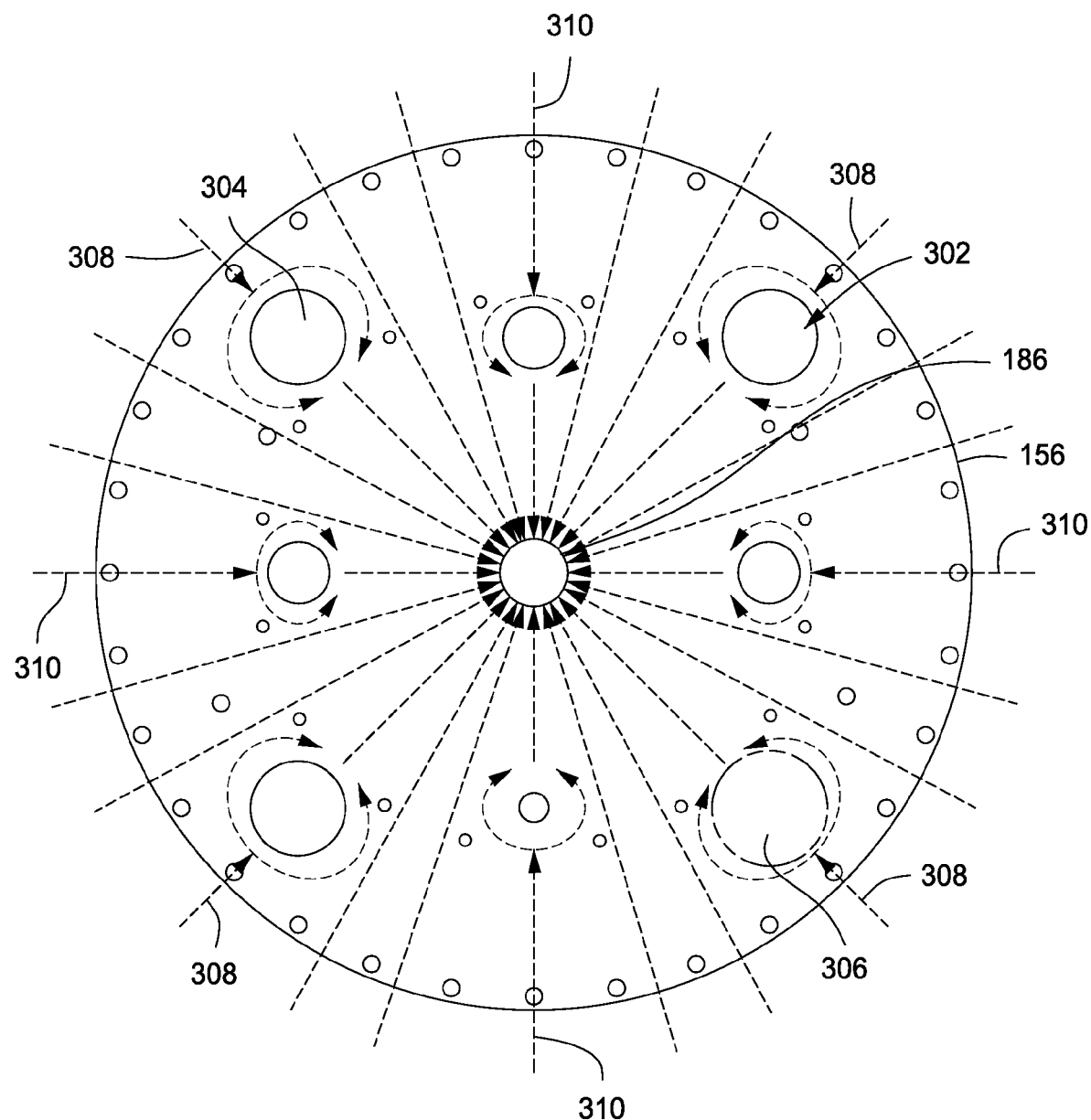
FIG. 3 depicts a schematic top view of a ground plate is accordance with some embodiments of the present invention.

The source distribution plate 158 and the ground plate 156 are illustrated in more detail in top views in FIGS. 2-3, respectively. The inventors have discovered that, even with a center RF feed provided, symmetry should be maintained on the RF hot (e.g., the source distribution plate 158) and RF ground (e.g., the ground plate 156) surfaces due to required cutouts in the surfaces for the functionality of the lid assembly. The cutouts located on the circular ground plane (e.g., the ground plate 156) and the RF distribution plane (e.g., the source distribution plate 158) are symmetric with respect to the center such that the RF travels similar distances as it distributes from and returns to the center feed.

As illustrated in FIGS. 2-3, the cutouts located on the grounding plate 156 and the source distribution plate 158 are symmetric about a central axis, e.g., on each of the grounding plate 156 and the source distribution plate 158, the cutout pattern is a symmetric pattern where there is a symmetric distribution of each cutout shape. However, this is merely one exemplary embodiment which maintains symmetry of RF distribution paths on the source distribution plate 158 and RF return paths on the grounding plate 156 in opposing radial directions on each of the source distribution plate 158 and the grounding plate 156. Alternatively, embodiments may include, for example, asymmetric cutout patterns about the central axis, where cutout shapes may be different, e.g., different sizes and/or different shapes or combinations of shapes and/or different radial distances from the central axis of the same sized shape, in opposing radial directions on each of the source distribution plate 158 and the grounding plate 156, so long as symmetry of RF distribution paths on the source distribution plate 158 and RF return paths on the grounding plate 156 are maintained in opposing radial directions on each of the source distribution plate 158 and the grounding plate 156. For example, the symmetry of the RF distribution paths and the RF return paths may be such that RF energy may travel a substantially similar overall travel length in each radial direction beginning proximate the center of the source distribution plate 158, travel through various surfaces of the chamber 100, and ending proximate the center of the grounding plate 156.

As illustrated in FIG. 2, the source distribution plate 158 may include a plurality of first features 202 disposed about a central axis of the PVD chamber 100. The plurality of first features 202 may include one or more of first openings 204 or first recesses 206 as illustrated in FIG. 2. Any feature 202 of the source distribution plate 158 may be located symmetrically on a common diameter with a corresponding feature to maintain symmetry. If the feature is a through hole, the corresponding feature on the common diameter may require the same hole diameter as illustrated in FIG. 2. However, the hole need not go completely through the source distribution plate 158 as the RF energy travels on the surface and traverses the hole via the circumference. The hole depth does not affect the symmetry of the RF path. Alternatively, as discussed above, features may be located asymmetrically on a common diameter, provided RF distribution paths traveling in opposing directions from the center of the plate 158 along the common diameter have about equal path lengths, e.g., the RF energy travels the same distance in opposing direction along the common diameter.

For example, a first opening 204 may be utilized to provide a component of the chamber 100 such as an electrical feed structure, magnetron assembly component or the like through the source distribution plate 158, such as into the cavity 170. For example, a first recess 206 may be utilized to preserve symmetry in a radial direction on an RF carrying surface of the source distribution plate 158 when there is no need to provide an opening through the source distribution plate 158 because there is no corresponding chamber component. Alternatively, first openings may be utilized in place of first recesses even if no chamber component is placed through the opening. As illustrated in FIG. 2, the plurality of first features 202 may be symmetrically disposed about the central axis 186.

As illustrated in FIG. 3, the ground plate 156 may include a plurality of second features 302 disposed about a central axis of the PVD chamber 100. The plurality of second features 302 may include one or more of second openings 306 or second recesses 306 as illustrated in FIG. 3. For example, a second opening 306 may be utilized to provide a component of the chamber 100 such as an electrical feed structure, magnetron assembly component or the like through the ground plate 156, such as into the cavity 170. For example, a second recess 306 may be utilized to preserve symmetry in a radial direction on an RF carrying surface of the ground plate 156 when there is no need to provide an opening through the ground plate 156 because there is no corresponding chamber component. Alternatively, second openings may be utilized in place of second recesses even if no chamber component is placed through the opening. As illustrated in FIG. 3, the plurality of second features 302 may be symmetrically disposed about the central axis 186. Alternatively, similar to embodiments discussed for the source distribution plate, asymmetric patterns of the plurality of the second features 302 may be possible while maintaining symmetry, e.g., equal path lengths, of opposing RF return paths along a common diameter of the grounding plate 156.

The size of various elements, such as shafts, electrodes, or the like that may place through a first and/or second feature 202, 302 may be minimized as much as possible, therefor facilitating keeping size of the first and/or second features 202, 302 as small as possible to minimize disruption of the RF energy distribution. In some embodiments, the first and second features 202, 302 may be placed as far from the center as possible, for example, taking into account the various elements that may be place through a first or second feature 202, 302 and how those elements operate in the chamber 100. Locating the features further away from the center of the source and distribution plates advantageously facilitates minimizing RF energy disruption due to the lower RF current density at those locations as compared to locations closer to the center. Thus, the minimization of the various elements and/or the feature size and/or the placement of the first and/or second features 202, 302 as far from the central axis as possible can advantageously provide a more uniform distribution of RF energy along each radial direction.

As illustrated in FIGS. 2-3, a first feature 202 disposed along a given radial RF distribution path 208 may be substantially similar in dimension, such as radius or the like, to a corresponding second feature 302 disposed along a corresponding radial RF return path 308. As used herein, correspondence between the first and second features and the radial RF distribution and RF return paths refers to the similarity of geometric location if the planes of the radial RF distribution and RF return paths were overlaid (for example, from a top view of the target assembly). Also as used herein, substantially similarity in dimension or references to dimensions that are about equal (e.g., diameter, length, or the like) refer to dimensions where the smaller dimension is within a 10 percent variation of the larger dimension.

As illustrated in FIGS. 2-3, radial RF distribution and corresponding return paths of varying lengths may exist. For example, as illustrated in FIG. 2, there are four radial RF distribution paths labeled 208 symmetrically disposed about the central axis 186 on the source distribution plate 158. Similarly, as illustrated in FIG. 3, there are four corresponding RF return paths labeled 308 that are symmetrically disposed about the central axis 186 on the ground plate 156. Further, there may be four second radial RF distribution paths labeled 210 symmetrically disposed about the central axis 186 on the source distribution plate 158 and having a different path length between the central axis and the peripheral edge of the source distribution plate 158 than that of the radial RF distribution paths 208. Similarly, there may be four corresponding second radial RF return paths labeled 310 corresponding to the four second radial RF distribution paths 210 and having a different path length than the four radial RF return paths 308. As illustrated in FIGS. 2-3, a similar radial RF distribution path 208, 210 and similar radial RF return path 308, 310 can be produced using either an opening or a recess as discussed above.

As illustrated in FIG. 2, a first distance of any given radial RF distribution path 208 (210) between the central axis 186 and a peripheral edge of the source distribution plate 158 may be about equal to a second distance of an opposing radial RF distribution path 208 (210) along a common diameter of the source distribution plate 158. Similarly, as illustrated in FIG. 3, a third distance of any given radial RF return path 308 (310) may be about equal to a fourth distance of an opposing radial RF return path 308 (310) along a common diameter of the grounding plate 156. In addition, in some embodiments, the first, second, third, and fourth distances may be substantially equal.

Returning to FIG. 1, the target assembly 102 has the RF power source 182 connected to an electrode 154 (e.g., a RF feed structure). The RF power source 182 may include an RF generator and a matching circuit, for example, to minimize reflected RF energy reflected back to the RF generator during operation. For example, RF energy supplied by the RF power source 182 may range in frequency from about 13.56 MHz and to about 162 MHz or above. For example, non-limiting frequencies such as 13.56 MHz, 27.12 MHz, 60 MHz, or 162 MHz can be used.

In some embodiments, a second energy source 183 may be coupled to the target assembly 102 to provide additional energy to the target 114 during processing. In some embodiments, the second energy source 183 may be a DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled to the target assembly 102 in any location suitable to electrically couple the DC energy to the target 114, such as the electrode 154 or some other conductive member (such as the source distribution plate 158, discussed below). In embodiments where the second energy source 183 is a second RF power source, the second energy source may be coupled to the target assembly 102 via the electrode 154.

The electrode 154 may be cylindrical or otherwise rod-like and may be aligned with a central axis 186 of the PVD chamber 100 (e.g., the electrode 154 may be coupled to the target assembly at a point coincident with a central axis of the target, which is coincident with the central axis 186). The electrode 154, aligned with the central axis 186 of the PVD chamber 100, facilitates applying RF energy from the RF source 182 to the target 114 in an axisymmetrical manner (e.g., the electrode 154 may couple RF energy to the target at a "single point" aligned with the central axis of the PVD chamber). The central position of the electrode 154 helps to eliminate or reduce deposition asymmetry in substrate deposition processes. The electrode 154 may have any suitable diameter, however, the smaller the diameter of the electrode 154, the closer the RF energy application approaches a true single point. For example, although other diameters may be used, in some embodiments, the diameter of the electrode 154 may be about 0.5 to about 2 inches. The electrode 154 may generally have any suitable length depending upon the configuration of the PVD chamber. In some embodiments, the electrode may have a length of between about 0.5 to about 12 inches. The electrode 154 may be fabricated from any suitable conductive material, such as aluminum, copper, silver, or the like. Alternatively, in some embodiments, the electrode 154 may be tubular. In some embodiments, the diameter of the tubular electrode 154 may be suitable, for example, to facilitate providing a central shaft for the magnetron.

The electrode 154 may pass through the ground plate 156 and is coupled to a source distribution plate 158. The ground plate 156 may comprise any suitable conductive material, such as aluminum, copper, or the like. The open spaces between the one or more insulators 160 allow for RF wave propagation along the surface of the source distribution plate 158. In some embodiments, the one or more insulators 160 may be symmetrically positioned with respect to the central axis 186 of the PVD chamber 100 Such positioning may facilitate symmetric RF wave propagation along the surface of the source distribution plate 158 and, ultimately, to a target 114 coupled to the source distribution plate 158. The RF energy may be provided in a more symmetric and uniform manner as compared to conventional PVD chambers due, at least in part, to the central position of the electrode 154

One or more portions of a magnetron assembly 196 may be disposed at least partially within the cavity 170. The magnetron assembly provides a rotating magnetic field proximate the target to assist in plasma processing within the process chamber 104. In some embodiments, the magnetron assembly 196 may include a motor 176, a motor shaft 174, a gearbox 178, a gearbox shaft 184, and a rotatable magnet (e.g., a plurality of magnets 188 coupled to a magnet support member 172).

In some embodiments, the magnetron assembly 196 is rotated within the cavity 170. For example, in some embodiments, the motor 176, motor shaft 174, gear box 178, and gearbox shaft 184 may be provided to rotate the magnet support member 172. In conventional PVD chambers having magnetrons, the magnetron drive shaft is typically disposed along the central axis of the chamber, preventing the coupling of RF energy in a position aligned with the central axis of the chamber. To the contrary, in embodiments of the present invention, the electrode 154 is aligned with the central axis 186 of the PVD chamber. As such, in some embodiments, the motor shaft 174 of the magnetron may be disposed through an off-center opening in the ground plate 156. The end of the motor shaft 174 protruding from the ground plate 156 is coupled to a motor 176. The motor shaft 174 is further disposed through a corresponding off-center opening through the source distribution plate 158 (e.g., a first opening 146) and coupled to a gear box 178. In some embodiments, one or more second openings 198 may be disposed though the source distribution plate 158 in a symmetrical relationship to the first opening 146 to advantageously maintain axisymmetric RF distribution along the source distribution plate 158. The one or more second openings 198 may also be used to allow access to the cavity 170 for items such as optical sensors or the like.

The gear box 178 may be supported by any suitable means, such as by being coupled to a bottom surface of the source distribution plate 158. The gear box 178 may be insulated from the source distribution plate 158 by fabricating at least the upper surface of the gear box 178 from a dielectric material, or by interposing an insulator layer 190 between the gear box 178 and the source distribution plate 158, or the like. The gear box 178 is further coupled to the magnet support member 172 via the gear box shaft 184 to transfer the rotational motion provided by the motor 176 to the magnet support member 172 (and hence, the plurality of magnets 188).

The magnet support member 172 may be constructed from any material suitable to provide adequate mechanical strength to rigidly support the plurality of magnets 188. For example, in some embodiments, the magnet support member 188 may be constructed from a non-magnetic metal, such as non-magnetic stainless steel. The magnet support member 172 may have any shape suitable to allow the plurality of magnets 188 to be coupled thereto in a desired position. For example, in some embodiments, the magnet support member 172 may comprise a plate, a disk, a cross member, or the like. The plurality of magnets 188 may be configured in any manner to provide a magnetic field having a desired shape and strength.

Alternatively, the magnet support member 172 may be rotated by any other means with sufficient torque to overcome the drag caused on the magnet support member 172 and attached plurality of magnets 188, for example due to the cooling fluid 192, when present, in the cavity 170. For example, in some embodiments, (not shown), the magnetron assembly 196 may be rotated within the cavity 170 using a motor 176 and motor shaft 174 disposed within the cavity 170 and directly connected to the magnet support member 172 (for example, a pancake motor). The motor 176 must be sized sufficiently to fit within the cavity 170, or within the upper portion of the cavity 170 when the divider 194 is present. The motor 176 may be an electric motor, a pneumatic or hydraulic drive, or any other process-compatible mechanism that can provide the required torque.

The substrate support 106 has a material-receiving surface facing a principal surface of a target 114 and supports the substrate 108 to be sputter coated in planar position opposite to the principal surface of the target 114. The substrate support 106 may support the substrate 108 in a first volume 120 of the process chamber 104. The first volume 120 may be a portion of the inner volume of the process chamber 104 that is used for processing the substrate 108 (e.g., a processing volume) and may be separated from the remainder of the inner volume (e.g., a non-processing volume) during processing of the substrate 108. The first volume 120 is defined as the region above the substrate support 106 during processing (for example, between the target 114, the shield 138, and the substrate support 106 when in a processing position).

In some embodiments, the substrate support 106 may be vertically movable to allow the substrate 108 to be transferred onto the substrate support 106 through a load lock valve (not shown) in the lower portion of the process chamber 104 and thereafter raised to a deposition, or processing position. A bellows 122 connected to a bottom chamber wall 124 may be provided to maintain a separation of the inner volume of the process chamber 104 from the atmosphere outside of the process chamber 104 while facilitating the vertical movement of the substrate support 106. One or more gases may be supplied from a gas source 126 through a mass flow controller 128 into the lower part of the process chamber 104. An exhaust port 130 may be provided and coupled to a pump (not shown) via a valve 132 for exhausting the interior of the process chamber 104 and to facilitate maintaining a desired pressure inside the process chamber 104.

An RF bias power source 134 may be coupled to the substrate support 106 in order to induce a negative DC bias on the substrate 108. In addition, in some embodiments, a negative DC self-bias may form on the substrate 108 during processing. For example, RF energy supplied by the RF bias power source 134 may range in frequency from about 2 MHz to about 60 MHz, for example, non-limiting frequencies such as 2 MHz, 13.56 MHz, or 60 MHz can be used. In other applications, the substrate support 106 may be grounded or left electrically floating. Alternatively or in combination, a capacitance tuner 136 may be coupled to the substrate support 106 for adjusting voltage on the substrate 108 for applications where RF bias power may not be desired.

The process chamber 104 further includes a process kit shield, or shield, 138 to surround the processing, or first volume, of the process chamber 104 and to protect other chamber components from damage and/or contamination from processing. In some embodiments, the shield 138 may be coupled to a ledge 140 of an upper grounded enclosure wall 116 of the process chamber 104. As illustrated in FIG. 1, the chamber lid 101 may rest on the ledge 140 of the upper grounded enclosure wall 116. Similar to the lower grounded enclosure wall 110, the upper grounded enclosure wall 116 may provide a portion of the RF return path between the lower grounded enclosure wall 116 and the grounding assembly 103 of the chamber lid 101. However, other RF return paths are possible, such as via the grounded shield 138.

The shield 138 extends downwardly and may include a generally tubular portion having a generally constant diameter that is larger than that of the substrate support 106. The shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). A first ring 148 (e.g., a cover ring) rests on the top of the u-shaped portion (e.g., a first position of the first ring 148) when the substrate support 106 is in its lower, loading position (not shown) but rests on the outer periphery of the substrate support 106 (e.g., a second position of the first ring 148) when the substrate support 106 is in its upper, deposition position (as illustrated in FIG. 1) to protect the substrate support 106 from sputter deposition. An additional deposition ring (not shown) may be used to shield the periphery of the substrate 108 from deposition.

In some embodiments, a magnet 152 may be disposed about the process chamber 104 for selectively providing a magnetic field between the substrate support 106 and the target 114. For example, as shown in FIG. 1, the magnet 152 may be disposed about the outside of the chamber wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

While the foregoing is directed to embodiments of the present invention, other and further embodiments of the invention may be devised without departing from the basic scope thereof.

The invention claimed is:

1. A substrate processing system, comprising:
 a target having a front side and an opposing backside, and a central axis normal to the front side and the backside, the target including a source material disposed on the front side, the source material to be deposited on a substrate;
 a source distribution plate having a first diameter bisected by the central axis and disposed between a first peripheral edge, the source distribution plate further having a target facing side opposing the backside of the target and a target opposing side opposite the target facing side, wherein the source distribution plate is electrically coupled to the target along a peripheral edge of the target, and wherein the source distribution plate includes a plurality of first features disposed in the target opposing side and about the central axis such that a first distance of a first radial RF distribution path between the central axis and the first peripheral edge along a given first diameter is about equal to a second distance of an opposing second radial RF distribution path between the central axis and the first peripheral edge along the given first diameter; and
 a ground plate opposing the target opposing side of the source distribution plate, the ground plate having a second diameter bisected by the central axis and disposed between a second peripheral edge, the grounding plate further having a plurality of second features disposed about the central axis and corresponding to the plurality of first features, wherein a third distance of a first radial RF return path between the second peripheral edge and the central axis along a given second diameter is about equal to a fourth distance of an opposing second radial RF return path between the second peripheral edge and the central axis along the given second diameter.

2. The substrate processing system of claim 1, further comprising:
 a cavity disposed between the backside of the target and the source distribution plate; and
 a magnetron assembly comprising a rotatable magnet disposed within the cavity and having an axis of rotation that is aligned with a central axis of the target.

3. The substrate processing system of claim 2, wherein the magnetron assembly further comprises:
 a shaft disposed through one of the first features in the source distribution plate and a corresponding one of the second features in the ground plate, wherein the shaft is rotationally coupled to the rotatable magnet and not aligned with the central axis of the target.

4. The substrate processing system of claim 1, further comprising:
 an RF feed structure coupled to the source distribution plate to provide RF energy to the source distribution plate, wherein the RF feed structure is aligned with the central axis of the target.

5. The substrate processing system of claim 1, wherein the plurality of first features and the plurality of corresponding second features are symmetrically disposed about the central axis.

6. The substrate processing system of claim 1, wherein the plurality of first features further comprises:
 a plurality of first openings disposed through the source distribution plate.

7. The substrate processing system of claim 6, wherein the plurality of second features further comprises:
 a plurality of second openings disposed through the ground plate and corresponding to at least some of the plurality of first openings.

8. The substrate processing system of claim 7, wherein the plurality of second features further comprises:
 a plurality of second recesses disposed in a surface of the ground plate along which RF energy travels during operation, wherein the plurality of second recesses corresponds to at least some of the plurality of first openings.

9. The substrate processing system of claim 8, wherein the plurality of first features further comprises:

a plurality of first recesses disposed in a surface of the source distribution plate along which RF energy travels during operation, wherein the plurality of first recesses correspond to at least some of the plurality of second openings or the plurality of second recesses.

10. A substrate processing system, comprising:
a target having a front side and an opposing backside, and a central axis normal to the front side and the backside, the target including a source material disposed on the front side, the source material to be deposited on a substrate;
a source distribution plate having a first diameter bisected by the central axis and disposed between a first peripheral edge, the source distribution plate further having a target facing side opposing the backside of the target and a target opposing side opposite the target facing side, wherein the source distribution plate is electrically coupled to the target along a peripheral edge of the target, and wherein the source distribution plate includes a plurality of first features disposed in the target opposing side and about the central axis such that a first distance of a first radial RF distribution path between the central axis and the first peripheral edge along a given first diameter is about equal to a second distance of an opposing second radial RF distribution path between the central axis and the first peripheral edge along the given first diameter;
a ground plate opposing the target opposing side of the source distribution plate, the ground plate having a second diameter bisected by the central axis and disposed between a second peripheral edge, the grounding plate further having a plurality of second features disposed about the central axis and corresponding to the plurality of first features, wherein a third distance of a first radial RF return path between the second peripheral edge and the central axis along a given second diameter is about equal to a fourth distance of an opposing second radial RF return path between the second peripheral edge and the central axis along the given second diameter;
an RF feed structure coupled to the source distribution plate to provide RF energy to the source distribution plate, wherein the RF feed structure is aligned with the central axis;
a cavity disposed between the backside of the target and the source distribution plate; and
a magnetron assembly comprising a rotatable magnet disposed within the cavity and having an axis of rotation that is aligned with a central axis of the target.

11. The substrate processing system of claim 10, wherein the magnetron assembly further comprises:
a shaft disposed through one of the first features in the source distribution plate and a corresponding one of the second features in the ground plate, wherein the shaft is rotationally coupled to the rotatable magnet and not aligned with the central axis of the target.

12. The substrate processing system of claim 10, wherein the plurality of first features and the plurality of corresponding second features are symmetrically disposed about the central axis.

13. The substrate processing system of claim 12, wherein the plurality of first features further comprises:
a plurality of first openings disposed through the source distribution plate.

14. The substrate processing system of claim 13, wherein the plurality of second features further comprises:
a plurality of second openings corresponding to at least some of the plurality of first openings.

15. The substrate processing system of claim 14, wherein the plurality of second features further comprises:
a plurality of second recesses disposed in a surface of the ground plate along which RF energy travels during operation, wherein the plurality of second recesses corresponds to at least some of the plurality of first openings.

16. A substrate processing system, comprising:
a target having a front side and an opposing backside, and a central axis normal to the front side and the backside, the target including a source material disposed on the front side, the source material to be deposited on a substrate;
a source distribution plate having a first diameter bisected by the central axis and disposed between a first peripheral edge, the source distribution plate further having a target facing side opposing the backside of the target and a target opposing side opposite the target facing side, wherein the source distribution plate is electrically coupled to the target along a peripheral edge of the target, and wherein the source distribution plate includes a plurality of first features symmetrically disposed in the target opposing side and about the central axis such that a first distance of a first radial RF distribution path between the central axis and the first peripheral edge along a given first diameter is about equal to a second distance of an opposing second radial RF distribution path between the central axis and the first peripheral edge along the given first diameter;
a ground plate opposing the target opposing side of the source distribution plate, the ground plate having a second diameter bisected by the central axis and disposed between a second peripheral edge, the grounding plate further having a plurality of second features symmetrically disposed about the central axis and corresponding to the plurality of first features, wherein a third distance of a first radial RF return path between the second peripheral edge and the central axis along a given second diameter is about equal to a fourth distance of an opposing second radial RF return path between the second peripheral edge and the central axis along the given second diameter; and
an RF feed structure coupled to the source distribution plate to provide RF energy to the source distribution plate, wherein the RF feed structure is aligned with the central axis.

17. The substrate processing system of claim 16, wherein the plurality of first features further comprises:
a plurality of first openings disposed through the source distribution plate.

18. The substrate processing system of claim 17, wherein the plurality of second features further comprises:
a plurality of second openings corresponding to at least some of the plurality of first openings; and
a plurality of second recesses disposed in a surface of the ground plate along which RF energy travels during operation, wherein the plurality of second recesses corresponds to at least some of the plurality of first openings.

19. The substrate processing system of claim 1, wherein the first distance of a first radial RF distribution path between the central axis and the first peripheral edge along any given diameter is equal to the second distance of an opposing second radial RF distribution path between the central axis and the first peripheral edge along the common given diameter.

20. The substrate processing system of claim 4, wherein the RF feed structure is coupled to the center of the target.

\* \* \* \* \*